(12) United States Patent
Shimazawa et al.

(10) Patent No.: US 10,020,193 B1
(45) Date of Patent: Jul. 10, 2018

(54) METHOD FOR LASER ANNEALING WITH LASER BEAM RADIATED VIA THROUGH HOLE

(71) Applicant: TDK Corporation, Tokyo (JP)

(72) Inventors: Koji Shimazawa, Tokyo (JP); Tsutomu Chou, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 15/178,702

(22) Filed: Jun. 10, 2016

Related U.S. Application Data

(60) Provisional application No. 62/175,564, filed on Jun. 15, 2015.

(51) Int. Cl.
H01L 21/268 (2006.01)
H01L 21/02 (2006.01)
H01L 21/324 (2006.01)
H01L 21/225 (2006.01)

(52) U.S. Cl.
CPC .... H01L 21/02675 (2013.01); H01L 21/0268 (2013.01); H01L 21/02354 (2013.01); H01L 21/268 (2013.01); H01L 21/324 (2013.01); H01L 21/2254 (2013.01)

(58) Field of Classification Search
CPC ......... H01L 21/02675; H01L 21/02678; H01L 21/0268; H01L 21/02354; H01L 21/02345
See application file for complete search history.

(56) References Cited

U.S. PATENT DOCUMENTS

2012/0001173 A1* 1/2012 Suzuki ............. H01L 29/66742 257/43
2016/0086802 A1* 3/2016 Hong ................ H01L 21/02664 438/104

FOREIGN PATENT DOCUMENTS

| JP | 2000-349042 A | 12/2000 |
| JP | 2001-44120 A | 2/2001 |
| JP | 3903761 B2 | 4/2003 |
| WO | 2011/055691 A1 | 5/2011 |

OTHER PUBLICATIONS

Boyd et al., Absorption of infrared radiation in silicon, J. Appl. Phys. 55(8), Apr. 15, 1984, pp. 3061-3063, American Institute of Physics.

* cited by examiner

Primary Examiner — Julio J Maldonado
Assistant Examiner — Evan Clinton
(74) Attorney, Agent, or Firm — Posz Law Group, PLC

(57) ABSTRACT

A laser annealing method that includes forming a second layer having through holes on a first layer, and radiating laser light with a wavelength of 3 μm or greater to the first layer via the through holes.

17 Claims, 11 Drawing Sheets

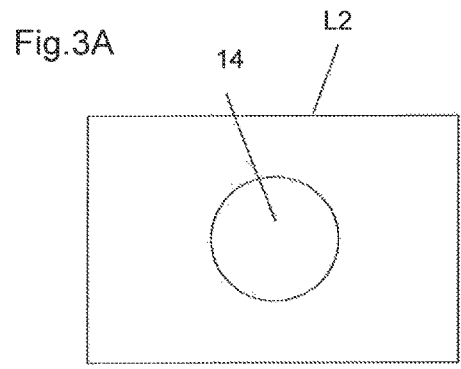
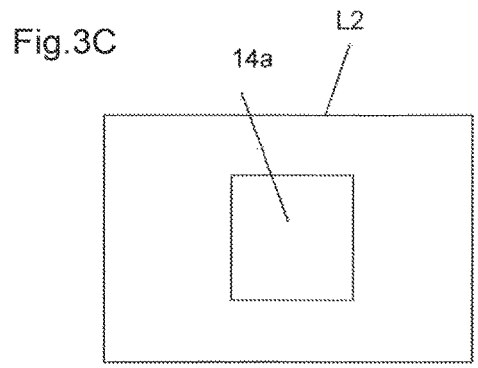
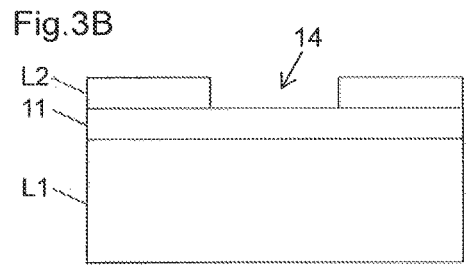
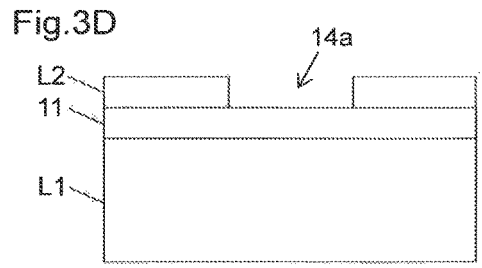
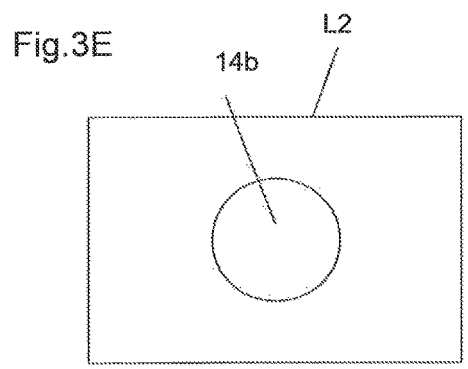
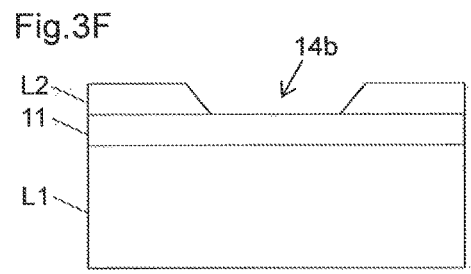

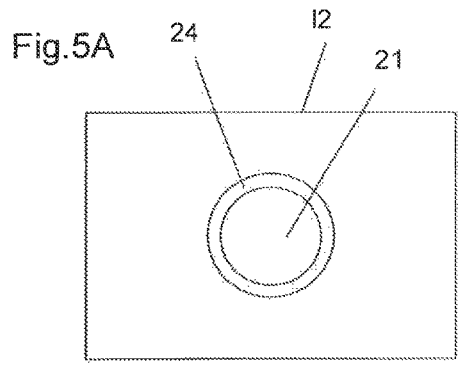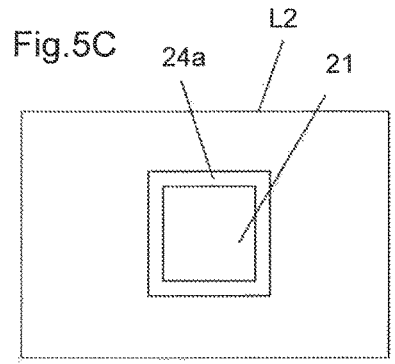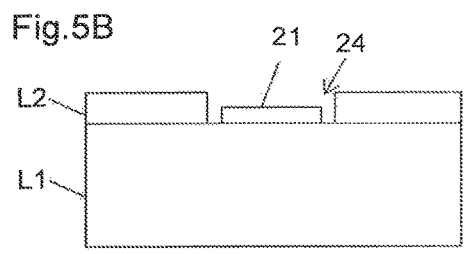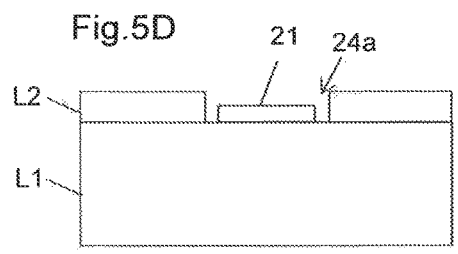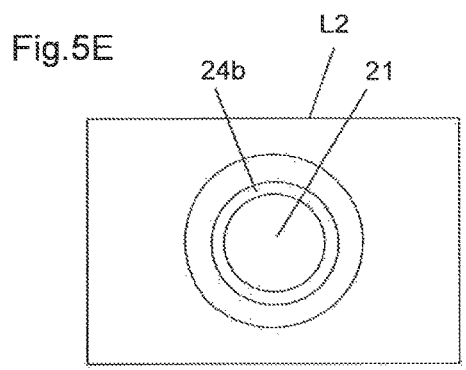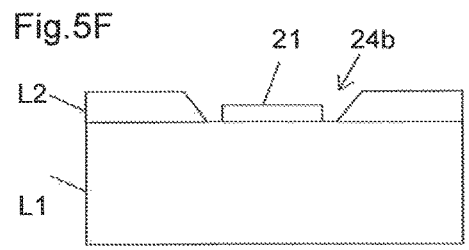

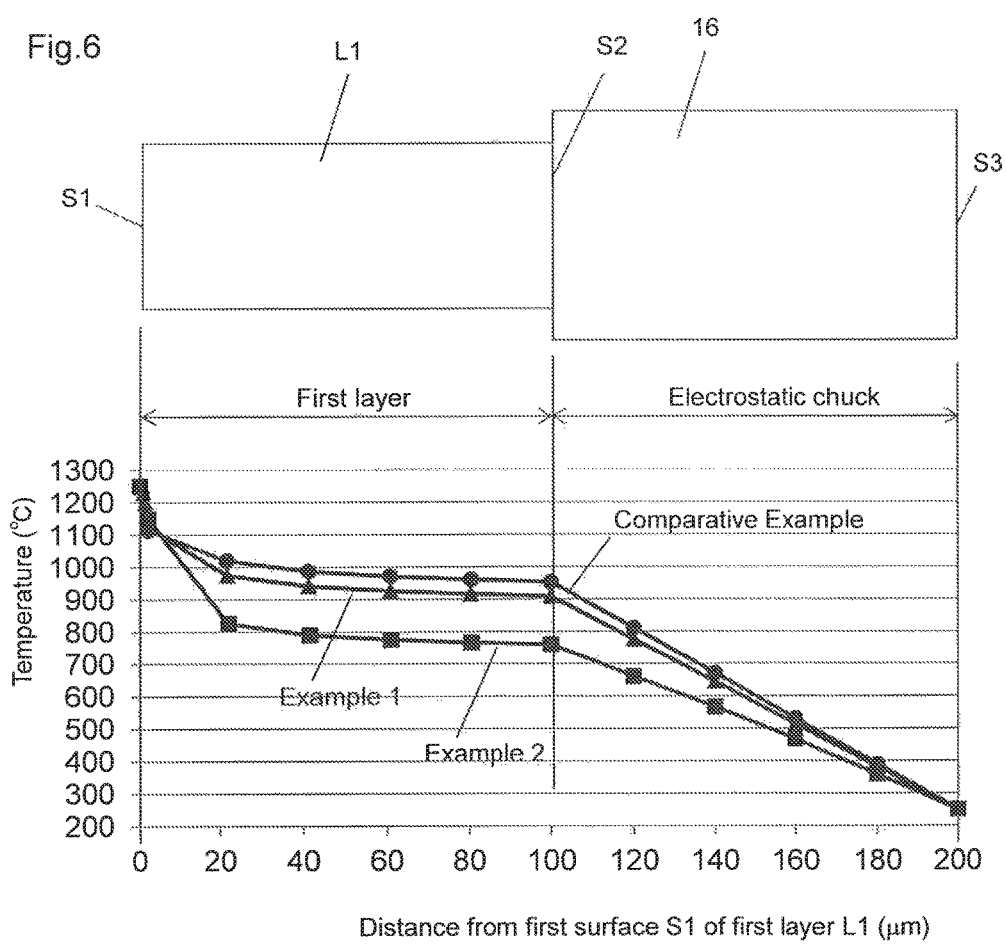

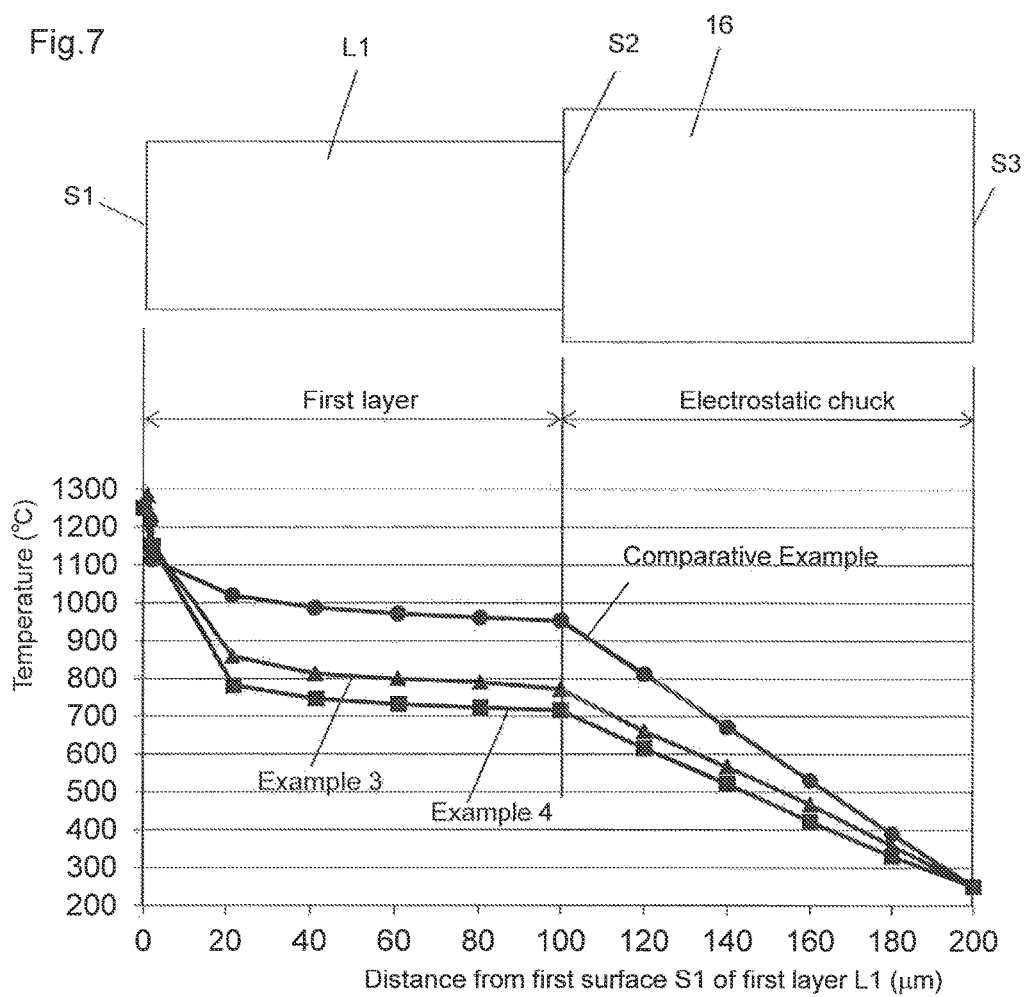

METHOD FOR LASER ANNEALING WITH LASER BEAM RADIATED VIA THROUGH HOLE

CROSS-REFERENCE TO RELATED APPLICATION

This application is based upon and claims the benefit of priority from Provisional Patent Application No. 62/175,564 filed on Jun. 15, 2015; the entire contents of which are incorporated herein by reference.

BACKGROUND OF THE INVENTION

1. Field of the Invention

The present invention relates to a laser annealing method, and particularly relates to a laser annealing method for local heating with laser light.

2. Description of the Related Art

For the purpose of improvement of the crystallinity of a substrate, activation of impurities in a semiconductor manufacturing process and/or the like, substrates or semiconductor elements are sometimes thermally treated. As a thermal treatment method, a laser annealing method using laser light is known.

Japanese Patent Application Laid-Open No. 2001-44120 discloses a method for improving the crystallinity of a silicon thin film formed on a substrate in order to realize a high-mobility thin film transistor. After a pulse laser in an ultraviolet region, such as an excimer laser, is radiated, the crystal grain size of a silicon thin film is increased by radiating the pulse laser in the visible range, and the crystallinity is improved.

WO2011/055691 discloses a method for activating impurities introduced into a silicon substrate in order to manufacture an ultrathin insulated gate bipolar transistor (IGBT). An aluminum electrode, a polyimide layer and the like are formed on the front surface side of the silicon substrate, and a field stop layer and a collector layer are formed on the back surface side of the silicon substrate. The field stop layer and the collector layer are formed by activating n-type impurities and p-type impurities introduced from the back surface of the silicon substrate with laser light.

Depending upon the target of thermal treatment, only the shallow range from the surface radiated by the laser light needs to be locally heated. According to WO2011/055691, a $CO_2$ laser with a wavelength of 3 µm or greater is radiated from the back surface of the silicon substrate for 1,000 microseconds or less. With this process, only the back surface of the silicon substrate is locally heated, and n-type impurities and p-type impurities can be activated without damaging the aluminum electrode and the polyimide layer formed on the front surface.

With the method described in WO2011/05569, a specific temperature difference between the back surface and the front surface of the silicon substrate can be obtained, but it is not sufficient depending upon the target of the thermal treatment.

The objective of the present invention is to provide a laser annealing method enabling a large temperature difference to be realized between the surface of a silicon substrate on which laser light is radiated and its back surface.

SUMMARY OF THE INVENTION

The laser annealing method of the present invention includes forming a second layer having a through hole on the first layer, and radiating a laser light with a wavelength of 3 µm or greater via the through hole.

The above objective, other objectives, characteristics and advantages of the present invention will become clear with an explanation referring to the attached drawings where the present invention is exemplified.

BRIEF DESCRIPTION OF THE DRAWINGS

FIGS. 3A to 3F are conceptual diagrams showing the shape of a through hole in a second layer in the laser annealing method relating to the first embodiment of the present invention;

FIGS. 5A to 5F are conceptual diagrams showing the shape of a through hole in the second layer in a laser annealing method relating to the second embodiment of the present invention;

FIG. 6 is a graph showing the temperature distribution of a first substrate in Examples 1 and 2 and a Comparative Example; and FIG. 7 is a graph showing the temperature distribution of the first substrate in Examples 3 and 4 and the Comparative Example.

DETAILED DESCRIPTION OF THE INVENTION

Embodiments of a laser annealing method of the present invention are explained with reference to the drawings by using a bipolar transistor as an example.

Figure 1:
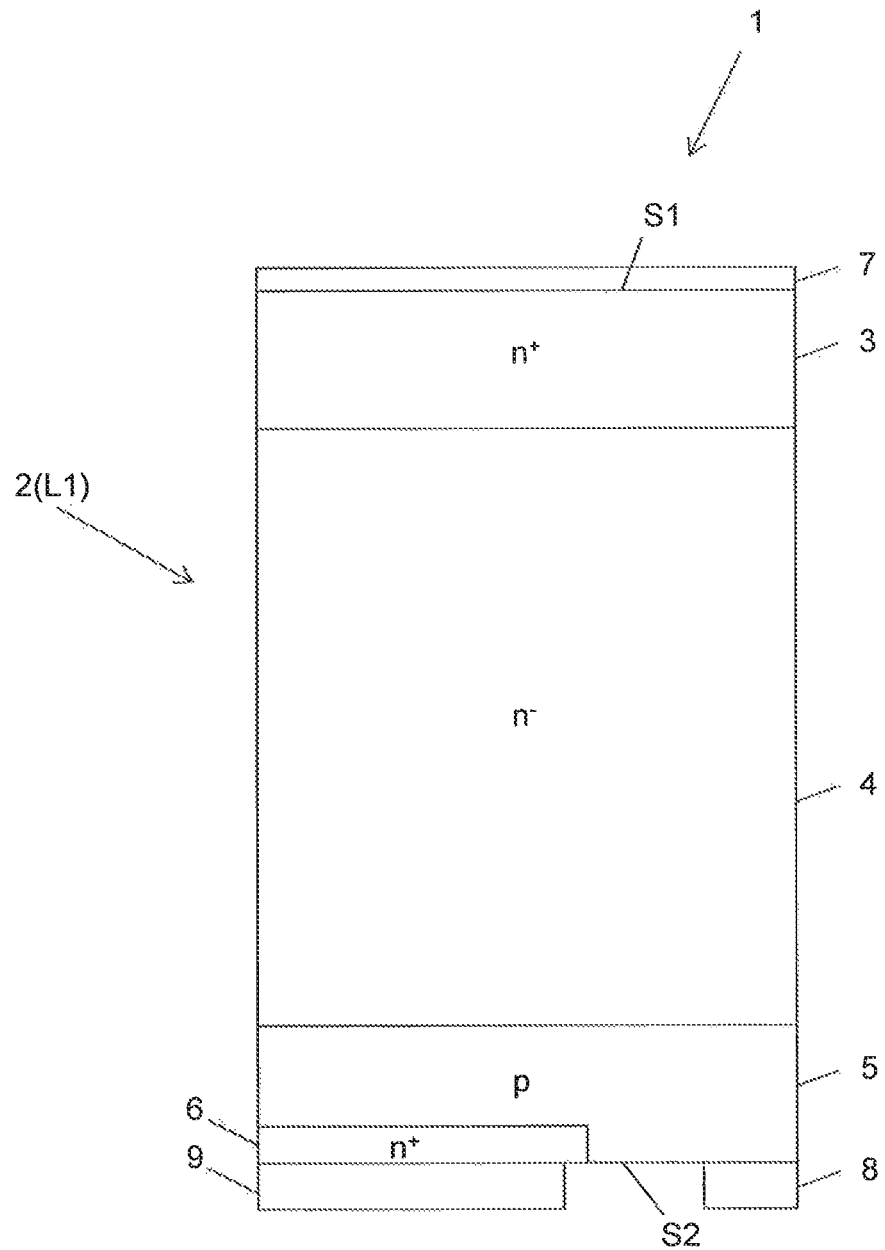
FIG. 1 is a conceptual cross-sectional view showing one example of a semiconductor device where the present invention is applied.

FIG. 1 shows a conceptual cross-sectional view of a bipolar transistor 1. A substrate 2 of the bipolar transistor 1 has an n$^-$ layer 4, an n$^+$ layer 3 and a p layer 5 formed at both sides of the n$^-$ layer 4 and an n$^+$ layer 6 formed at the opposite side of the p layer 5 from the n$^-$ layer 4. A collector electrode 7, a base electrode 8 and an emitter electrode 9 are connected to the n$^+$ layer 3, the p layer 5 and the n layer 6, respectively. The collector electrode 7, the base electrode 8 and the emitter electrode 9 are formed with a metal film, such as Al or Ni. In the following explanation, the surface of the substrate 2 where the collector substrate 7 is formed is referred to as the first surface S1 and the surface of the substrate 2 where the base electrode 8 and the emitter electrode 9 are formed is referred to as the second surface S2.

The laser annealing method for the bipolar transistor 1 described above is explained with reference to FIGS. 2A to 2I. Here, it is assumed that the elements on the second surface S2 side of the bipolar transistor 1 (the base electrode 8, a polyimide layer (not shown) to protect the emitter electrode 9 and the like, in addition to the p layer 5, the n$^+$ layer 6, the base electrode 8 and the emitter electrode 9) have already been formed. It is assumed that ions are implanted into the substrate 2, and the n$^+$ layer 3 is also formed. Therefore, the bipolar transistor 1 is completed by radiating laser light from the first surface S1 and to heat and activate the n$^+$ layer 3, and forming the collector electrode 7 on the first surface S1.

Figure 2A:
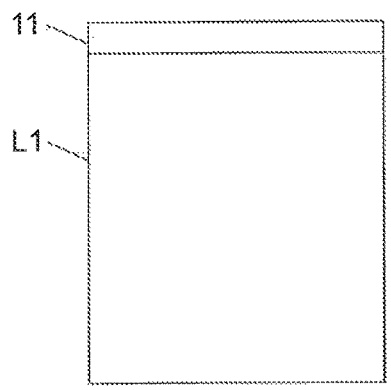
FIGS. 2A to 2I are conceptual diagrams showing steps of a laser annealing method relating to the first embodiment of the present invention.
Figure 2B:
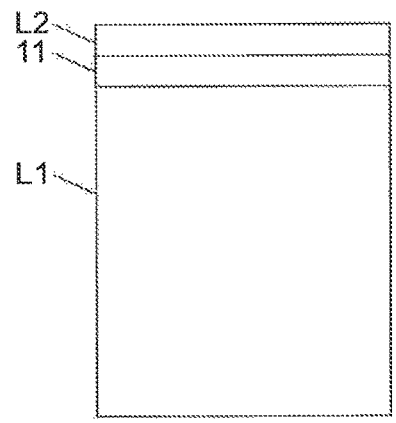
Figure 2C:
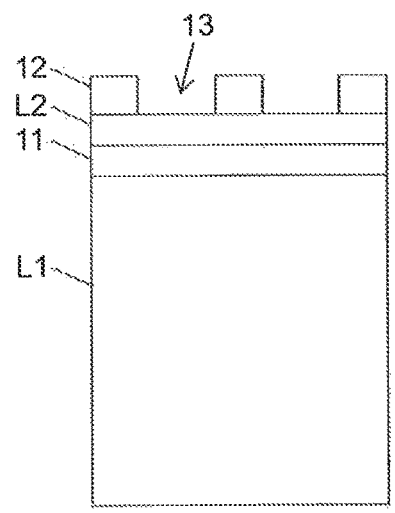
Figure 2D:
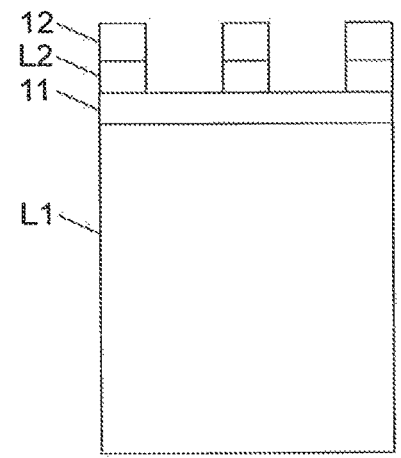
Figure 2E:
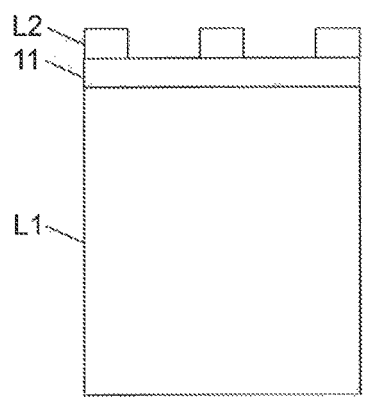

First, as shown in FIG. 2A, an $SiO_2$ layer (hereafter, referred to as light absorbing layer 11) with a film thickness of approximately 0.5 μm is formed on the substrate 2 (hereafter, referred to as first layer L1) using the sputtering method. Next, as shown in FIG. 2B, a Cu layer (hereafter, referred to as second layer L2) with a film thickness of approximately 1.0 μm is formed using the sputtering method. Next, as shown in FIG. 2C, a resist 12 having circular through holes 13 with a diameter of approximately 4 μm is formed using photolithography technology. Next, as shown in FIG. 2D, the second layer L2 that is not masked with the resist 12 is removed using ion milling. Next, as shown in FIG. 2E, the resist 12 is removed using a stripping solution. With this process, the second layer L2 is formed and includes the circular through holes 14 with a diameter of approximately 4 μm. FIG. 3A shows a top view of the through hole 14, and FIG. 3B shows a cross-sectional view of the through hole 14. The through hole 14 has a circular cross section, and the cross section is constant in the thickness direction of the second layer L2.

Figure 2F:
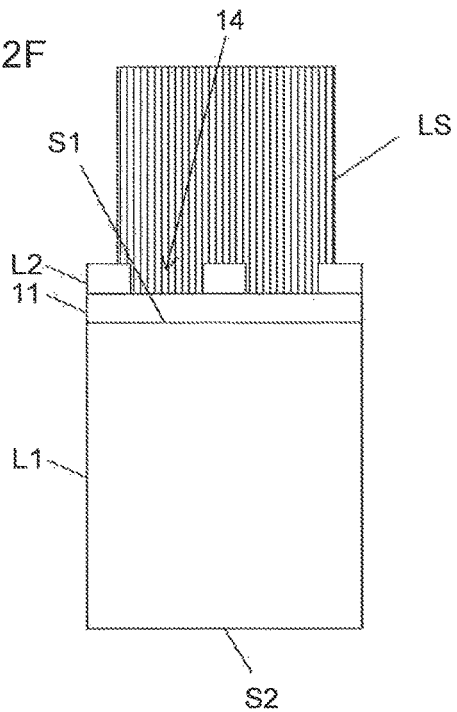

Next, as shown in FIG. 2F, $CO_2$ laser light LS (carbon dioxide gas laser light) with a wavelength of 10.3 μm is radiated to the through holes 14 with a $CO_2$ laser device. It is preferable that the radiation time of the laser light LS be 1,000 microseconds or less. The laser light LS is radiated so as to cover the through holes 14 with light flux of the laser light LS. In the illustrated example, although a plurality of through holes 14 are simultaneously radiated in order to radiate the range of the first surface S1 of the first layer L1 as wide as possible, each of the through hole 14 may be individually radiated. The laser light LS is reflected at the second layer L2, and is radiated to the light absorbing layer 11 through the through holes 14 which do not have the second layer L2. The light absorbing layer 11 absorbs the laser light LS and generates heat. Consequently, the light absorbing layer 11 efficiently heats the first layer L1 as a source of heat. In other words, the laser light LS indirectly heats the first surface S1 of the first layer L1 via the light absorbing layer 11. When radiation at a predetermined location ends, the radiation position of the laser light LS is shifted, and the laser light LS is radiated again. The process is further repeated, and the entire surface of the first surface S1 is heated.

Figure 2G:
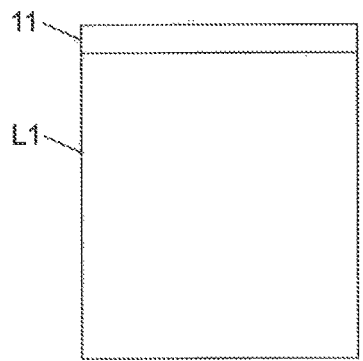
Figure 2H:
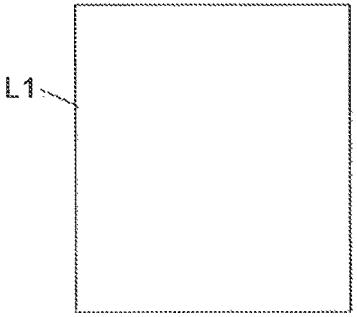
Figure 2I:
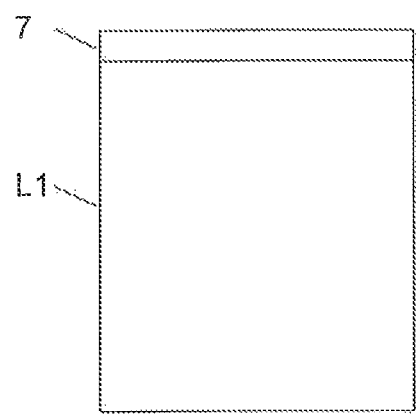

Next, as shown in FIG. 2G, the second layer L2 is removed using a ferric chloride solution. Then as shown in FIG. 2H, the light absorbing layer 11 is removed using chemical mechanical polishing (CMP). Then, as shown in FIG. 2I, the collector electrode 7 is formed on the first layer L1 using sputtering.

A thermal energy density is enhanced around the through holes 14 in the second layer L2. Compared to the case when the laser light is radiated without the placement of the second layer L2, the temperature of the first layer L1 in the vicinity of the through holes 14 is increased. Since energy (output) of laser light required for heating the portions in the vicinity of the through holes 14 of the first layer L1 to a predetermined temperature can be suppressed, the increase of the temperature of the second surface S2 is suppressed. Therefore, a great temperature difference can be provided between the first surface S1 and the second surface S2 of the first layer L1.

The second layer L2 can be formed with one or more materials selected from Au, Ag, Cu, Ru, Rh, Ir, Pt, Pd, Zr, Ta, Cr, Ti, Ni, Co, Fe, Al, Zn, Hf and W. The second layer L2 can be configured with one layer, but may have two or more layers. In the latter case, each layer can be formed with one or more materials selected from these materials. Therefore, the second layer L2 can be formed with two layers of, for example, a Cu layer and an Au layer. Since the materials described above have a high reflective ratio against laser light, especially against a $CO_2$ laser, the energy of the laser light to be radiated can be locally input only into the vicinity of the through holes 14.

In particular, when the diameter of the through holes 14 in the second layer L2 is smaller than the wavelength of the laser light LS, the temperature of the first layer L1 in the vicinity of the through holes 14 can be further increased. It is believed that this is because electric field-enhanced light is generated in the vicinity of the through holes 14. The electric field-enhanced light is collective oscillation of free electric charges, and it is stationary mainly at the outer edges of the through holes 14. The electric field-enhanced light is a source of heat fixed in the vicinity of the through holes 14, and can locally efficiently heat the first surface S1 in the vicinity of the through holes 14 via the light absorbing layer 11.

The light absorbing layer 11 absorbs the laser light, stores heat and is heated to a high temperature. Consequently, the light absorbing layer 11 functions as a source of heat or a heating body to efficiently heat the vicinity of the first surface S1 of the first layer L1. If the light absorbing layer 11 is not provided, the energy of the laser light is partially transmitted to the inside of the first layer L1. The energy of the laser light is not efficiently used to heat the vicinity of the first surface S1, and the transmitted energy is diffused to the second surface S2. The light absorbing layer 11 not only efficiently heats the vicinity of the first surface S1 immediately below, but also suppresses the diffusion of the heat energy. Therefore, it is desirable that the light absorbing layer 11 be formed with a material that can easily absorb laser light. Specifically, it is desirable that the light absorbing layer 11 has a greater light absorption coefficient relative to the laser light than the first layer L1 and the second layer L2. It is preferable that the light absorbing layer 11 be formed from a dielectric body material containing silicon, and specifically, it is preferable that the light absorbing layer 11 be made from $SiO_2$ or SiN or contain $SiO_2$ or SiN. The light absorbing layer 11 can also be formed with oxide or nitride of aluminum, titanium or tantalum. Since the light absorbing layer 11 is provided in order to efficiently heat the first layer L1 immediately below the through holes 14, it may be located at least between the through holes 14 and the first layer L1, and it does not have to be provided on the entire surface of the first surface L1. The light absorbing layer 1 can also be omitted.

It is desirable for the laser light LS to have a wavelength of 3 μm or greater. Since, as mentioned above, it is desirable that the diameter of the though hole 14 be smaller than the wavelength of the laser light LS, further larger through holes 14 can be formed by selecting laser light with a longer wavelength. The radiation range of the laser light can be expanded by providing larger through holes 14. Further, with the laser light LS with the longer wavelength, the reflective ratio of the second layer L2 is enhanced, and the energy absorption efficiency of the light absorbing layer 11 is enhanced.

The cross-sectional shape of the through hole 14 is not limited to only circular, rather, various shapes, such as rectangular, square or elliptical may also be selected. FIG. 3C shows a top view of a rectangular though hole 14a, and FIG. 3D shows a cross sectional view of the rectangular through hole 14a. In the case of a rectangular through hole, it is desirable that the length of the shorter side (one side in the case of a square) be smaller than the wavelength of the laser light. In the case of an elliptical through hole, it is desirable that the length of a short axis be smaller than the wavelength of laser light.

As shown in the top view of FIG. 3E and the cross-sectional view of FIG. 3F, it is desirable for the through hole 14b in the second layer L2 to have a tapered shape where its cross-sectional area becomes smaller as the through hole 14b extends closer to the first layer 11. In other words, in the circular through hole, it is desirable that the diameter becomes smaller as it extends closer to the first layer L1, and in the rectangular through hole, it is desirable that the side length becomes smaller as the through hole extends closer to the first layer L. Because the cross-sectional area of the through hole 14b at the first layer L1 side is small, the range where the electric field-enhanced light exists is further localized on the first layer L1 side, and the heating efficiency of the first layer L1 can be enhanced.

FIGS. 4A to 4J are pattern diagrams showing procedures for the laser annealing method of the second embodiment of the present invention. In the present embodiment, a light absorbing layer 21 with a greater light absorption coefficient relative to laser light than that of the first layer L1 and the second layer L2 is formed within the through hole 24. Matters not described below in the second embodiment are similar to those in the first embodiment.

Figure 4A:
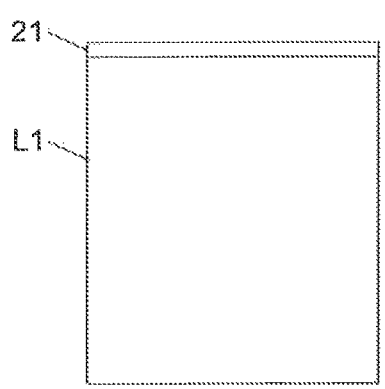
FIGS. 4A to 4J are conceptual diagrams showing steps for a laser annealing method relating to the second embodiment of the present invention.
Figure 4B:
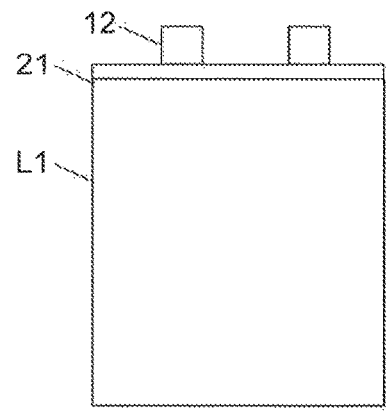
Figure 4C:
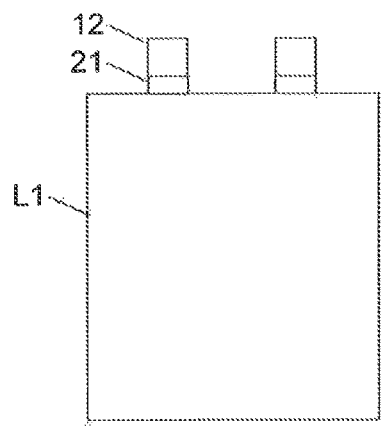
Figure 4D:
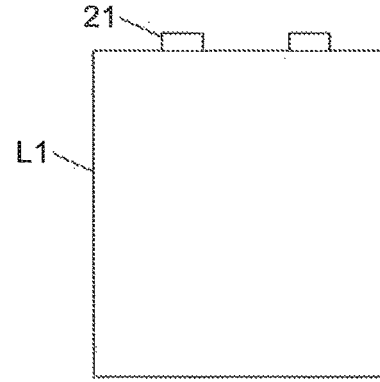
Figure 4E:
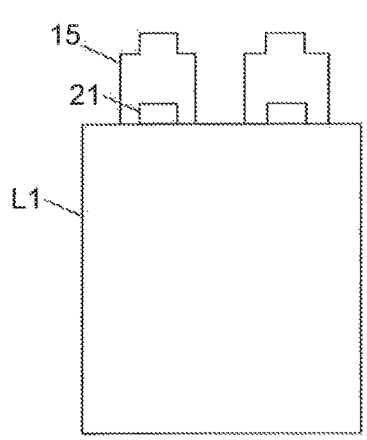
Figure 4F:
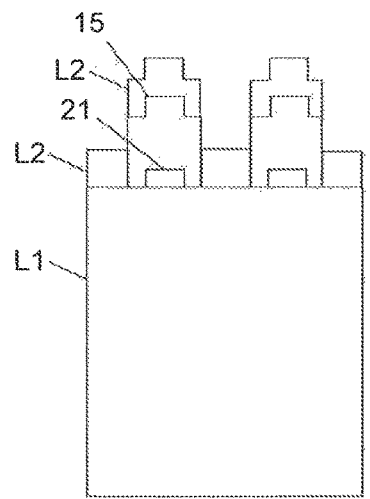
Figure 4G:
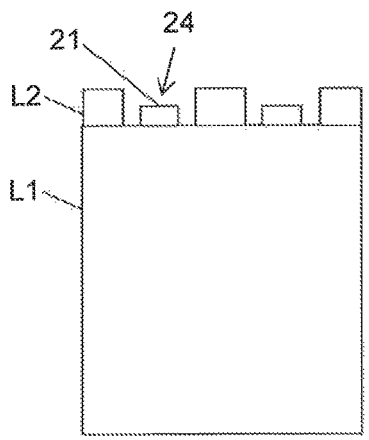

First, as shown in FIG. 4A, the light absorbing layer 21 with a film thickness of approximately 0.5 µm is formed on the first layer L1 using the sputtering method. Next, as shown in FIG. 4B, the circular resist 12 with a diameter of approximately 3 µm is formed using photolithography technology. Next, as shown in FIG. 4C, the light absorbing layer 21 that is not masked with the resist 12 is removed by the ion milling. Next, as shown in FIG. 4D, the resist 12 is removed using a stripping solution. With this process, a circular light absorbing layer 21 with a diameter of approximately 3 µm is formed on the first layer L. Next, as shown in FIG. 4E, a resist 15 with a diameter of approximately 4 µm to cover the light absorbing layer 21 is formed. Next, as shown in FIG. 4F, the second layer L2 with a film thickness of approximately 1.0 µm is formed using the sputtering method. Next, as shown in FIG. 4G, the resist 15 is removed using the stripping solution. With this process, the second layer L2 that includes the light absorbing layer 21 is formed inside the through holes 24. FIG. 5A shows a top view of the through hole 24, and FIG. 5B shows a cross sectional view of the through hole 24. The through hole 24 and the light absorbing layer 21 have circular cross sections, respectively, and their cross sections are constant in the thickness direction of the second layer L2. Since the light absorbing layer 21 is away from the second layer L2, transmission of heat stored in the light absorbing layer 21 to the second layer L2 is prevented.

Figure 4H:
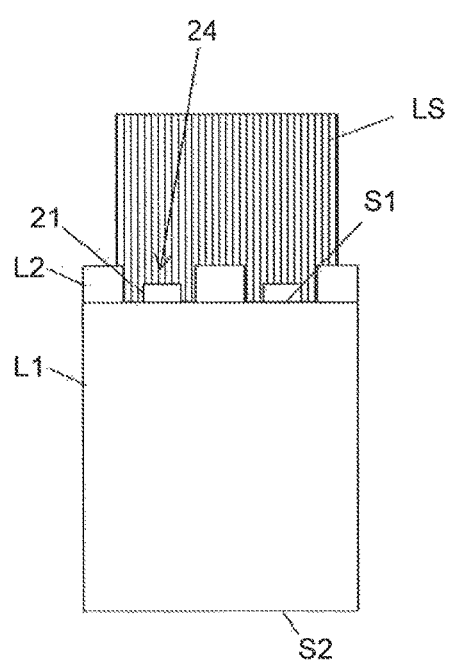

Next, as shown in FIG. 4H, $CO_2$ laser light LS (carbon dioxide laser light) with a wavelength of 10.3 µm is radiated to the through holes 24 with a $CO_2$ laser device. It is desirable that the radiation time of the laser light LS be 1,000 microseconds or less. The laser light LS is radiated so as to cover the through holes 24 with a light flux of the laser light LS. In the illustrated example, in order to radiate the first surface S1 as wide range as possible at once, a plurality of the through holes 24 are simultaneously radiated, but each of the through hole 24 can also be individually radiated. The laser light LS is reflected at the second layer L2 and is radiated to the light absorbing layer 21 within the through holes 24 which do not have the second layer L2. The light absorbing layer 21 absorbs the laser light LS and generates heat. Consequently, the light absorbing layer 21 efficiently heats the first layer L1 as a source of heat. When the radiation ends at a predetermined position, the radiation position of the laser light LS is shifted and the laser light LS is radiated again. This process is further repeated, thereby heating the entire surface of the first surface S1.

Figure 4I:
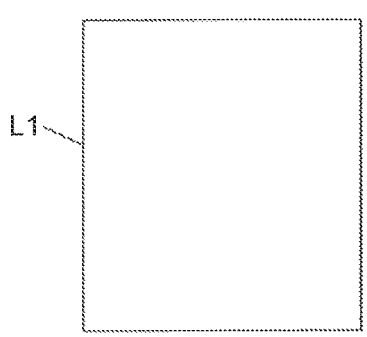
Figure 4J:
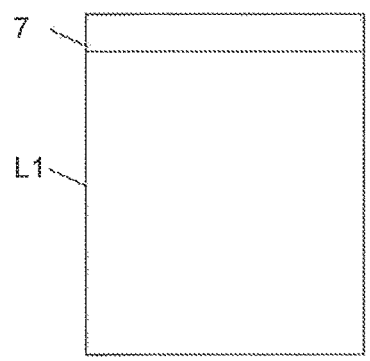

Next, as shown in FIG. 4I, the second layer L2 is removed using a ferric chloride solution, and the light absorbing layer 21 is removed using CMP. Next, as shown in FIG. 4J, the collector electrode 7 is formed on the first layer L1 with sputtering.

The light absorbing layer 21 may contact the second layer L2. Since, after the step shown in FIG. 4D, the second layer L2 can be formed without forming the resist 15 shown in FIG. 4E, the manufacturing process is simplified.

Even in the present embodiment, the through holes 24 can have various shapes. As shown in the top view of FIG. 5C and the cross-sectional view of FIG. 5D, the through holes 24 can alternatively be rectangular, such as the rectangular through hole 24a. As shown in the top view of FIG. 5E and the cross-sectional view of FIG. 5F, the through hole 24b in the second layer L2 can have a tapered shape where its cross-sectional area can be smaller as the through hole 24b extends closer to the first layer L1. For additional details, see the first embodiment.

In each of the embodiments described above, the materials of the first layer L1 to be subject to heating are not limited. A substrate of derivatives, such as silicon or $Al_2O_3$—TiC (AlTiC), may be usable, or metallic conductors may be usable. Further, a specific portion on the substrate 2 or a specific element provided on the substrate 2 may be subject to heating. In that case, only one through hole 14 or 24 can be formed on the specific portion or element so as to allow a laser light to radiate to the specific portion or element.

EXAMPLES

As shown in FIG. 6, a substrate (the first layer L1) made from a silicon wafer was supported by an electrostatic chuck 16 on the second surface S2, and laser light was radiated from the first surface S1 and temperature distribution in the thickness direction of the first layer L1 was obtained. The thickness of both the first layer L1 and the electrostatic chuck 16 was adjusted at 100 µm, and a surface S3 of the electrostatic chuck 16 that did not contact the first layer L1 was maintained at 250° C. Thermal conductivity of the electrostatic chuck 16 was set at 1 W/m/K. The thermal conductivity of the first layer L1 was set at 20 W/m/K, which was the thermal conductivity of the single crystal silicon at approximately 900° C. Assuming the activation of impurities introduced into the first layer L1, annealing with a $CO_2$ laser was conducted so as to adjust the temperature of the area with the thickness up to 2 µm from the first surface S1 of the first layer L1 to be 1,100° C. or higher. The radiation time of the laser light was set for 600 microseconds. In Examples 1 and 2, the light absorbing layer 11 made from $SiO_2$ was formed on the first surface S1 of the first layer L1 to have 0.1 µm and 0.5 µm thicknesses, respectively, and the second layer L2 made from Cu was formed with 1 µm of thickness over the light absorbing layer 11. The second layer L2 was provided with the circular through holes 14 with a diameter of 4 µm. In the Comparative Example, the light absorbing layer 11 and the second layer L2 were not provided. An output of the laser was adjusted so as to allow the temperature of the first surface S1 of the first layer L1 to be the same in Examples 1 and 2 and the Comparative Example. FIG. 6 shows the results. The horizontal axis indicates the position of the first layer L1 and the electrostatic chuck 16 in the thickness direction measured from the first surface S1 of the first layer L1, and the vertical axis indicates the temperature.

In the Comparative Example, the second surface S2 of the first layer L1 was heated to 950° C. or higher. At this temperature, there is a possibility that elements (for example, the base electrode 8, the emitter electrode 9 or a polyimide layer) formed on the second surface S2 of the first layer L may be damaged. It is also possible to effectively cool the second surface S2 of the first layer L1 by devising the interface state between the first layer L and the electrostatic chuck 16, but there is a possibility to simultaneously affect the heating efficiency at the first surface S1 side.

The temperature of the second surface S2 of the first layer L1 was reduced by approximately 50° C. in Example 1 and by approximately 200° C. in Example 2, compared to the Comparative Example. This is because the heating efficiency of the first surface S1 of the first layer L1 was improved, and the first surface S1 of the first layer L1 could be heated to the same temperature as that in the Comparative Example with a smaller laser output than that in the Comparative Example. Consequently, thermal energy transmitted to the second surface S2 of the first layer L1 was reduced, and the temperature of the second surface S2 of the first layer L1 was reduced. The temperature of the second surface S2 of the first layer L1 is lower in Example 2 where the film thickness (0.5 µm) of the light absorbing layer 11 is greater, compared to Example 1 where the film thickness (0.1 µm) of the light absorbing layer 11 is smaller. It is believed that the first layer S1 of the first layer L1 is more efficiently heated because the heat capacity of the light absorbing layer 11 is greater. In Examples 1 and 2, a greater margin can be secured even in the adjustment of the interface state between the first layer L1 and the electrostatic chuck 16.

FIG. 7 shows Examples 3 and 4 and the Comparative Example. In Example 3, the light absorbing layer 11 made from $SiO_2$ was formed to be 0.5 µm of thickness on the first surface S1 of the first layer L1, and the second layer L2 made from Cu was formed over the light absorbing layer 11 to be 1 µm in thickness. The second layer L2 included the rectangular through holes 14a with 4 µm of side length. Example 4 corresponds to the second embodiment. The second layer L2 that includes the circular through holes 24 was directly formed on the first surface S1 of the first layer L1, and a nearly-cylindrical light absorbing layer 21 spaced away from the second layer L2 was formed inside of the through holes 24. The diameter of the circular through hole 24 was set at 4 µm, the diameter of the light absorbing layer 21 was set at 3 µm and the thickness was set at 1 µm. The Comparative Example is the same as the Comparative Example shown in FIG. 6, and the light absorbing layer 11 and the second layer L2 were not provided. In both Examples 3 and 4, the temperature of the second surface S2 of the first layer L1 was reduced compared to the Comparative Example.

The exemplary embodiments of the present invention were presented and were explained in detail, and readers should understand that the present invention may be modified without departing from the effect of the scope of attached claims or such scope.

What is claimed is:

1. A laser annealing method, comprising:
    above or on an upper surface of a first layer, forming a second layer having a through hole;
    forming a light absorbing layer that is not in direct contact with the second layer; and
    radiating laser light with a wavelength of 3 µm or greater to the first layer via the through hole, wherein
    the light absorbing layer has a greater light absorption coefficient relative to the laser light inside the through hole than that of the first layer and the second layer.

2. The laser annealing method according to claim 1, wherein the laser light is radiated for a time period of 1,000 microseconds or less.

3. The laser annealing method according to claim 1, wherein the laser light is $CO_2$ laser light with a wavelength of 10.6 µm.

4. The laser annealing method according to claim 1, wherein the through hole has one of a rectangular and a circular shape.

5. The laser annealing method according to claim 4, wherein the through hole has a circular shape with a smaller diameter than the wavelength of the laser light.

6. The laser annealing method according to claim 4, wherein the through hole has a rectangular shape having a smaller side length than the wavelength of the laser light.

7. The laser annealing method according to claim 1, wherein the second layer is formed with one or more materials to be selected from Au, Ag, Cu, Ru, Rh, Ir, Pt, Pd, Zr, Ta, Cr, Ti, Ni, Co, Fe, Al, Zn, Hf and W, and comprises one or more layers.

8. The laser annealing method according to claim 1, further comprising:
    forming the light absorbing layer between the through hole and the first layer that has a greater light absorption coefficient relative to the laser light than that of the first layer and the second layer.

9. The laser annealing method according to claim 8, wherein the light absorbing layer is made from a dielectric body material containing silicon.

10. The laser annealing method according to claim 9, wherein the light absorbing layer is made from $SiO_2$ or includes $SiO_2$.

11. The laser annealing method according to claim 8, wherein the first layer is not in direct contact with the second layer.

12. The laser annealing method according to claim 1, wherein the light absorbing layer is made from a dielectric body material containing silicon.

13. The laser annealing method according to claim 1, wherein the light absorbing layer is made from $SiO_2$ or includes $SiO_2$.

14. The laser annealing method according to claim 1, wherein the through hole is tapered so that its cross section becomes smaller as it extends closer to the first layer.

15. The laser annealing method according to claim 1, wherein
    the through hole extends through the second layer without completely separating the second layer such that the second layer surrounds the through hole.

16. The laser annealing method according to claim 1, wherein
    the through hole of the second layer has a shortest diameter or a shortest length that is smaller than the wavelength of the laser light to generate electric field-enhanced light in response to laser light.

17. A laser annealing method, comprising:
    forming a film having a through hole in a first layer;
    forming a light absorbing layer that is not in direct contact with the first layer; and
    radiating a laser light with a wavelength of 3 µm or greater for a time period of 1,000 microseconds or less to the first layer via the through hole, and generating electric field-enhanced light in the vicinity of the through hole, wherein the light absorbing layer has a greater light absorption coefficient relative to the laser light inside the through hole than that of the first layer and the film.

* * * * *